US012685098B2

(12) United States Patent
Fan et al.

(10) Patent No.: US 12,685,098 B2
(45) Date of Patent: Jul. 14, 2026

(54) MULTI-FUNCTION ETCHING SACRIFICIAL LAYERS TO PROTECT THREE-DIMENSIONAL DUMMY FINS IN SEMICONDUCTOR DEVICES

(71) Applicant: Taiwan Semiconductor Manufacturing Company, Hsinchu (TW)

(72) Inventors: Miao-Syuan Fan, Hsinchu (TW); Yen Chuang, Taipei (TW); Yuan-Lin Lin, Hsinchu (TW); Ta-Hsiang Kung, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 682 days.

(21) Appl. No.: 18/093,390

(22) Filed: Jan. 5, 2023

(65) Prior Publication Data

US 2024/0162079 A1     May 16, 2024

Related U.S. Application Data

(60) Provisional application No. 63/424,184, filed on Nov. 10, 2022.

(51) Int. Cl.
H10W 10/00          (2026.01)
H10D 84/83          (2025.01)
(Continued)

(52) U.S. Cl.
CPC ........ H10W 10/014 (2026.01); H10D 84/834 (2025.01); H10P 14/6334 (2026.01);
(Continued)

(58) Field of Classification Search
CPC ............. H10D 30/0241; H10D 30/024; H10D 84/834; H10P 14/6905; H10P 50/283; H10P 30/40
See application file for complete search history.

(56) References Cited

U.S. PATENT DOCUMENTS

2016/0329326 A1    11/2016   Balakrishnan et al.
2018/0248005 A1     8/2018   Lilak et al.
(Continued)

FOREIGN PATENT DOCUMENTS

TW          200527673 A1      8/2005
WO          2017111864 A1     6/2017

OTHER PUBLICATIONS

Taiwan Office Action—Application No. 11320803920 Dated: Aug. 12, 2024.
(Continued)

*Primary Examiner* — Christine S. Kim
*Assistant Examiner* — Andrew Victor Prostor
(74) *Attorney, Agent, or Firm* — Lippes Mathias LLP

(57)          ABSTRACT

A method of manufacturing a semiconductor device includes: forming mutually parallel three-dimensional (3D) conductive channels coated with a conformal sacrificial layer, the 3D conductive channels coated with the conformal sacrificial layer being formed on a semiconductor substrate; depositing a dielectric material to fill spaces between the 3D conductive channels coated with the conformal sacrificial layer, wherein a portion or all of the deposited dielectric material is doped with boron, lithium, or beryllium; performing chemical mechanical polishing (CMP) to remove a top portion of the deposited dielectric material and to expose tops of the 3D conductive channels; and after the CMP, removing the conformal sacrificial layer coating the 3D conductive channels by etching to form 3D dielectric fea-
(Continued)

tures spaced apart from the 3D conductive channels and comprising the deposited dielectric material.

20 Claims, 10 Drawing Sheets

(51) Int. Cl.

| | |
|---|---|
| *H10P 14/60* | (2026.01) |
| *H10P 14/69* | (2026.01) |
| *H10P 14/692* | (2026.01) |
| *H10P 30/40* | (2026.01) |
| *H10P 50/28* | (2026.01) |
| *H10W 10/17* | (2026.01) |
| *H10P 95/00* | (2026.01) |

(52) U.S. Cl.

CPC ...... *H10P 14/6905* (2026.01); *H10P 14/6939* (2026.01); *H10P 30/40* (2026.01); *H10P 50/283* (2026.01); *H10W 10/17* (2026.01); *H10P 95/062* (2026.01)

(56) References Cited

U.S. PATENT DOCUMENTS

| | | | | |
|---|---|---|---|---|
| 2019/0103304 A1* | 4/2019 | Lin | .................. | H01L 21/76229 |
| 2021/0376071 A1* | 12/2021 | Liu | .................. | H10D 30/6757 |
| 2021/0408286 A1* | 12/2021 | More | .................. | H10D 62/151 |
| 2022/0059678 A1* | 2/2022 | Jhan | .................. | H10D 30/6757 |

OTHER PUBLICATIONS

C.J. Wang et al., "Feasible approach for process integration of CMOS transistor gate/side-wall spacer patterning fabrication" in the book "Microelectronics Reliability", Published Aug. 3, 2010 by Elsevier Ltd.
Engelmann et al., "Nitride etching with hydrofluorocarbons", Journal of Vacuum Science and Technology B, vol. 35 No. 5; Published Sep. 26, 2017 by the American Vacuum Society.

\* cited by examiner

MULTI-FUNCTION ETCHING SACRIFICIAL LAYERS TO PROTECT THREE-DIMENSIONAL DUMMY FINS IN SEMICONDUCTOR DEVICES

This application claims the benefit of U.S. Provisional Application No. 63/424,184 filed Nov. 10, 2022 and titled "MULTI-FUNCTION ETCHING SACRIFICIAL LAYERS TO PROTECT THREE-DIMENSIONAL DUMMY FINS IN SEMICONDUCTOR DEVICES", which is incorporated herein by reference in its entirety.

BACKGROUND

The following relates to the integrated circuit (IC) arts, fin field-effect transistor (finFET) and other non-planar or three-dimensional (3D) transistor arts, IC, finFET, and/or 3D transistor fabrication arts, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
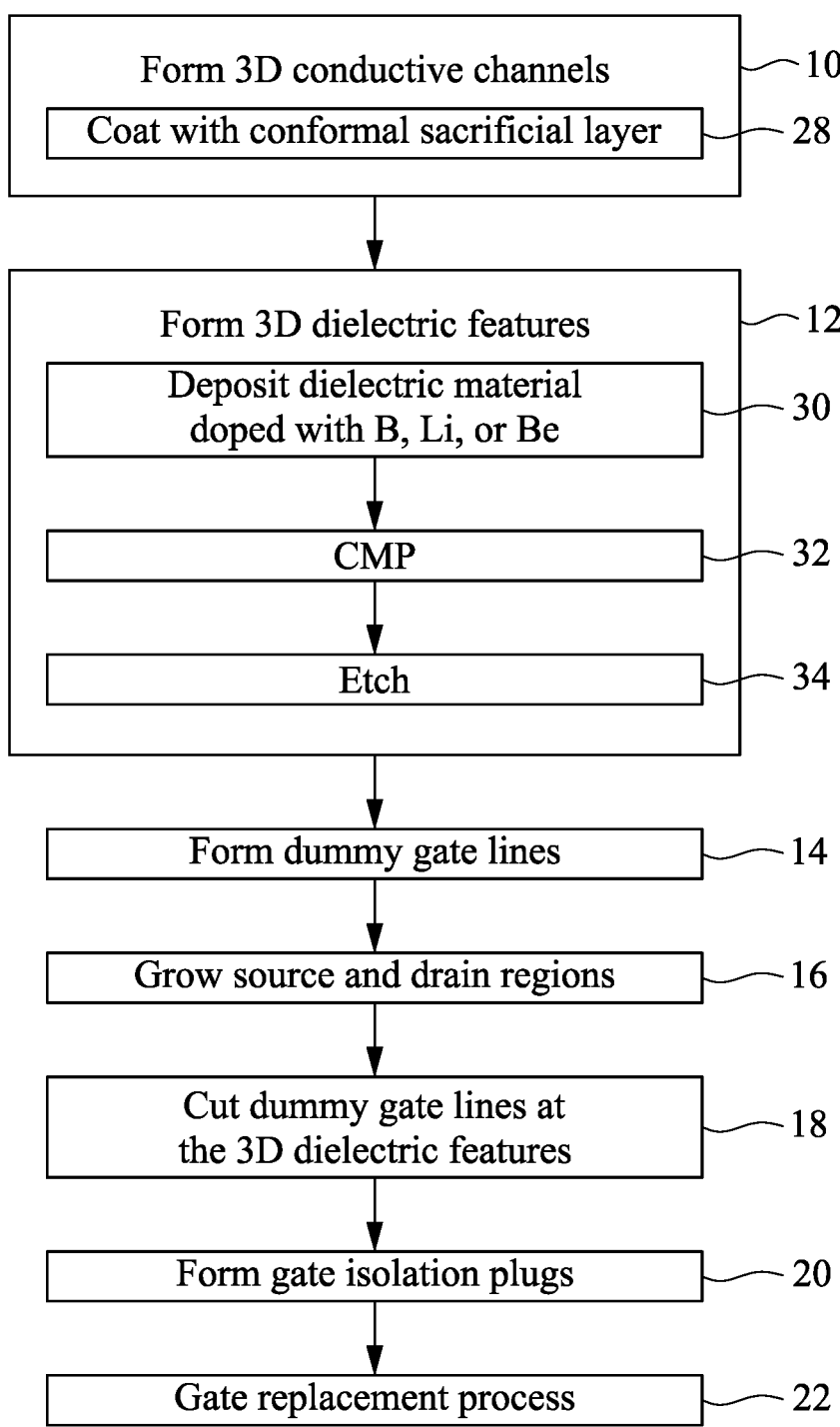
FIG. 1 diagrammatically illustrates a method of manufacturing a semiconductor device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fabrication workflows for fin field-effect transistor (finFET) devices, gate-all-around (GAA) transistors, and other types of non-planar or three-dimensional (3D) transistors generally include a channel in the form of a fin that is surrounded by the gate on three sides in the case of a finFET, or on all sides in a GAA or similar design. In a typical integrated circuit (IC) design employing 3D transistors, a set of mutually parallel fins are fabricated of a semiconductor material, e.g. by etching a semiconductor substrate to expose the fins or by depositing the fins as polycrystalline silicon formed on the substrate. In a replacement gate workflow, a dummy gate line with surrounding spacers is formed over the fins, with the dummy gate line oriented perpendicular to the fins. This is followed by fin etch-back and epitaxial deposition of source and drain regions of the transistors on opposite sides of the dummy gate line, followed by replacement of the dummy gate line with gate conductor material.

The fabrication workflow of ICs employing arrays of 3D transistors may also benefit from the formation of dummy fins. These are structures that are arranged parallel with the "active" fins. To distinguish from the dummy fins, the term "active fin" is used herein to refer to the fins that serve as the electrically conductive transistor channels in the final fabricated IC; while the dummy fins are not used as active channels of transistors in the final fabricated IC. The dummy fins may be made of a different material from the active fins, for example sometimes being made of an electrical insulator whereas the active fins are made of a semiconductor material. Dummy fins can serve various purposes in the IC fabrication workflow. For example, dummy fins can be used in forming electrically insulating gate isolation structures that electrically isolate sections of the gate line from one another to electrically isolate the gates of individual or groups of finished transistor devices from one another in accord with the IC design. In other applications, dummy fins can be used for optical proximity correction (OPC) to enhance a pattern density and pattern uniformity, or to improve chemical-mechanical polishing (CMP) performance during CMP steps of the transistor fabrication process, and/or so forth.

Various embodiments disclosed herein provide improvements in dummy fin formation (or, more generally, in the formation of 3D dielectric features typically arranged parallel with 3D conductive channels of 3D transistors). Various embodiments disclosed herein provide dummy fins with improved reliability and consequently improved device yield in integrated circuit (IC) manufacturing. For example, dummy fins fabricated as disclosed herein have improved resistance to ingress of oxygen and improved resistance to dummy fin oxidation, maintain lithographically defined critical dimension (CD), and can withstand a larger range of processing temperatures. These benefit are achieved in some embodiments by incorporating an interstitial dopant such as boron, lithium, or beryllium into a portion or all of the deposited dielectric material destined to form the dummy fins. Put another way, a portion or all of the dummy fin incorporates boron, lithium, or beryllium.

With reference now to FIG. 1, a nonlimiting illustrative example of a method for manufacturing a semiconductor device is shown. In an operation 10, three-dimensional (3D) conductive channels are formed. The 3D conductive channels may be fins destined to be the conductive channels of fin field-effect transistors (finFETs), or the 3D conductive channels may be multilayered structures destined to be the channels of gate-all-around (GAA) transistors, or may be nanosheet structures destined to be the channels of nano-structure devices, or so forth. In some illustrative examples herein, the 3D conductive channels are fins destined to be the conductive channels of finFETs. In general, the 3D conductive channels are elevated structures disposed on a semiconductor substrate (e.g. a silicon wafer, for example). As is known in the art, use of a 3D conductive channel in a 3D transistor (e.g., finFET or GAA transistor or nanosheet transistor) provides more surface area for contact between a surrounding gate, as compared with a planar transistor, which provides various transistor performance benefits. The fins or other 3D conductive structures typically comprise a semiconductor material such as silicon, silicon germanium ($Si_{1-x}Ge_x$, where $0 \leq x \leq 1$), a group III-group V compound semiconductor such as gallium arsenide (GaAs), or so forth.

In an operation 12, 3D dielectric features (e.g. 3D dummy fins) are formed. These may be spaced apart from the 3D conductive channels formed in operation 10, and comprise a dielectric material. In the case of finFET design, the 3D dielectric features are sometimes referred to as dummy fins. In a nonlimiting illustrative design layout, the fins or other 3D conductive channels are mutually parallel (at least within a designated region of the semiconductor substrate), and the dummy fins are parallel with the fins and interspersed between neighboring fins. As previously noted, the dummy fins formed in the operation 12 may serve various purposes, such as being used in forming electrically insulating gate isolation structures to electrically isolate sections of the gate line corresponding to different transistors, providing for optical proximity correction (OPC) to enhance a pattern density and pattern uniformity, improving chemical-mechanical polishing (CMP) performance during CMP steps of the transistor fabrication process, and/or so forth.

In an operation 14, for a nonlimiting illustrative example of a gate replacement process, dummy gate lines are formed. The dummy gate lines may, for example, comprise polysilicon lines whose sides are coated with silicon nitride spacers. In a nonlimiting illustrative fabrication approach, the dummy gate lines are oriented orthogonally to (i.e. at 90° to) the 3D conductive channels formed in operation 10, and hence cross over the 3D conductive channels and the parallel dummy fins that were formed in respective operations 10 and 12. In an operation 16, source and drain regions are epitaxially grown on the fins or other 3D conductive channels formed in operation 10. For fabricating a given transistor, the source and drain regions are epitaxially grown on opposite sides of the dummy gate line passing through the area of that transistor. In an operation 18, the dummy gate lines are cut at the dummy fins formed in the operation 12, and in an operation 20 gate isolation plugs are formed on the dummy fins. For example, the operation 18 may entail etching away the portions of the dummy gate line where it passes over the dummy fins (thus forming openings or "cuts" in the dummy gate line) and the operation 20 may entail filling those openings with an insulating material. The operations 18 and 20 thus divide the dummy gate line into segments that are electrically isolated from one another. Each segment can, for example, be destined to be the gate of a single transistor. In a gate replacement process 22, the dummy gate line is removed, for example by etching of the polysilicon using the silicon nitride spacers as etch stops and the resulting opening is filled by a gate metal (thus "replacing" the polysilicon dummy gate with the gate metal). Thereafter, additional operations not shown in FIG. 1 may be performed, such as back end-of-line (BEOL) processing to form metallization interconnect layers of an integrated circuit (IC) connecting the finFETs or other fabricated transistors.

The semiconductor device fabrication workflow described with reference to FIG. 1 is merely a nonlimiting illustrative example one fabrication workflow that can utilize the dummy fins or other 3D dielectric features formed in operation 12 parallel with the 3D conductive channels formed in the operation 10.

Figure 2:
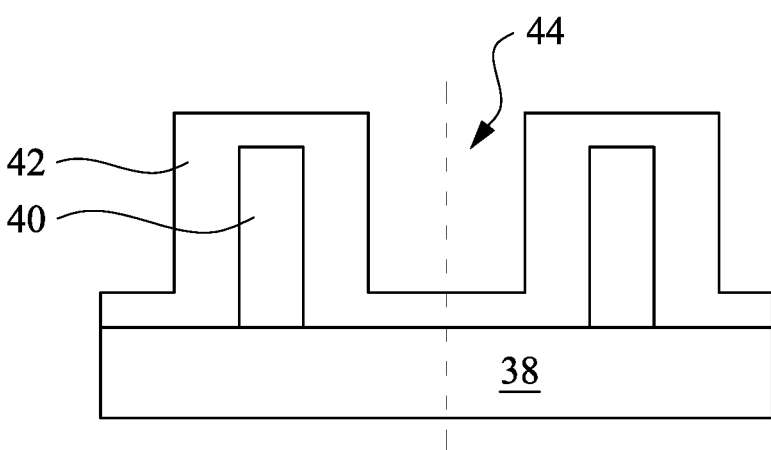
FIGS. 2, 3, 4, and 5 diagrammatically illustrate, by way of cross-sectional views, examples of the state of an under-fabrication device at various steps in the method of FIG. 1.

With continuing reference to FIG. 1 and with further reference to FIG. 2, an illustrative example of the operation 10 of FIG. 1 is diagrammatically shown in FIG. 2. Operation 10 of FIG. 1 includes forming, on a substrate 38, mutually parallel 3D conductive channels 40 which are coated with a conformal sacrificial layer 42. The substrate 38 may, for example, be a silicon substrate 38 in one nonlimiting example. The 3D conductive channels 40 may comprise silicon, $Si_{1-x}Ge_x$ or another semiconductor material. In the illustrative embodiment the 3D conductive channels 40 are fins 40 destined to be fins of a finFET. As other examples, the 3D conducting channels may be GAA structures destined to be channels of GAA transistors, or nanosheet structures destined to be channels of nanosheet transistors. FIG. 2 shows two illustrative 3D conductive channels 40 (e.g., two illustrative fins 40); however, the number of 3D conductive channels 40 may be greater than this. The 3D conductive channels 40 are mutually parallel in some region or area of the integrated circuit (IC) under manufacture, but different regions or areas of the IC may have the 3D conductive channels of transistors of the IC under-fabrication oriented in different directions. Note also that FIG. 2 shows a cross-sectional view of the 3D conductive channels 40, with the cut plane oriented perpendicular to the long direction of the 3D conductive channels 40. Said another way, the cut plane of the cross-sectional view of FIG. 2 (as well as of FIGS. 3-5 to be subsequently discussed) is perpendicular to the channel direction of the 3D conductive channels 40. In this illustrative example, it is assumed that the operation 10 which forms the 3D conductive channels 40 also includes an operation 28 (see FIG. 1) in which the 3D conductive channels 40 are coated with a conformal sacrificial layer 42. For example, the sacrificial layer 42 may be a silicon nitride material or another material that can be selectively etched over the semiconductor material of the 3D conductive channels 40. This coated sacrificial layer 42 is destined to be removed, for example by selective etching. The conformal sacrificial layer 42 coating the 3D conductive structures 40 is conformal as it covers the top and sides of the 3D conductive structures 40. In the illustrative example, the conformal sacrificial layer 42 is coated over the entire surface and thus also conformally coats the surface of the substrate 38 between the 3D conductive structures 40. Notably, the conformal sacrificial layer 42 does not fill in spaces 44 between the 3D conductive structures 40. These spaces 44 are destined to be the locations of the dummy fins (or, more generally, 3D dielectric features spaced apart from the 3D conductive channels).

It will further be noted that FIG. 2 includes a superimposed vertical dashed separator line, whose purpose will become evident shortly.

Figure 3:
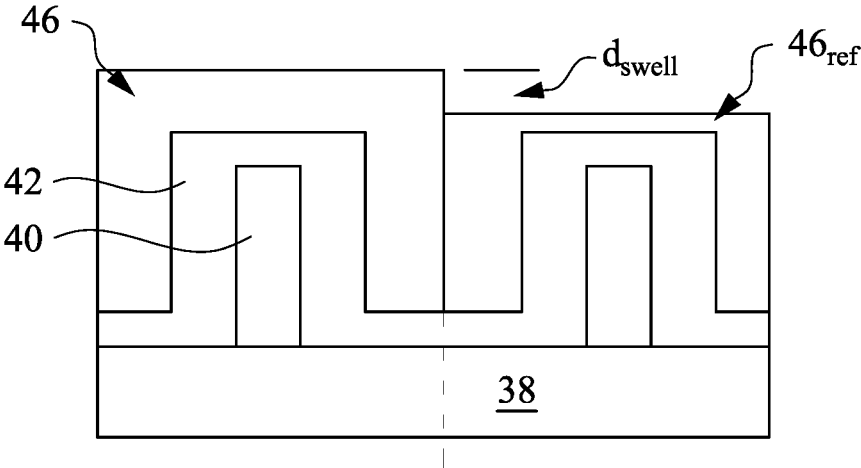
Figure 4:
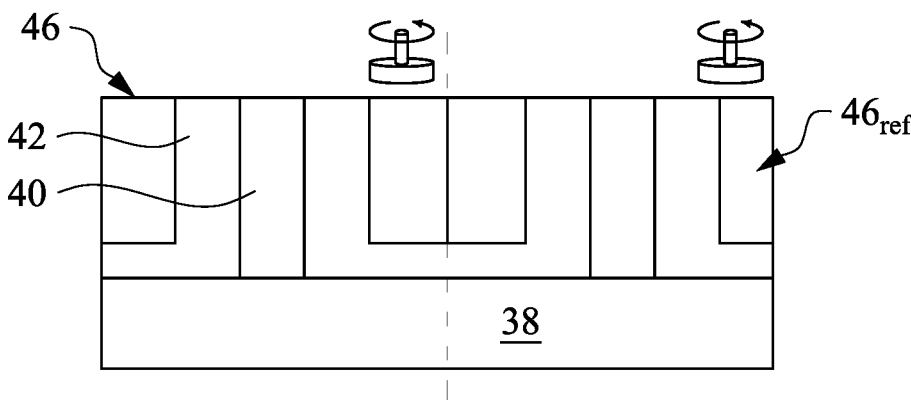
Figure 5:
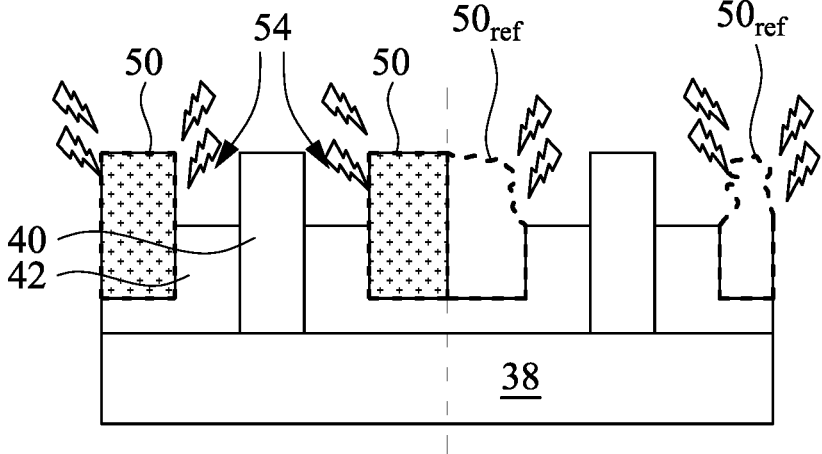

With continuing reference to FIG. 1 and with further reference now to FIGS. 3, 4, and 5, an illustrative example of the operation 12 of FIG. 1 is diagrammatically shown in FIGS. 3-5. As further shown in FIG. 1, In a deposition step 30 an example of which is diagrammatically depicted in FIG. 3, a dielectric material 46 is deposited to fill spaces 44 between the 3D conductive channels coated with the conformal sacrificial layer. In embodiments disclosed herein, a portion or all of the deposited dielectric material is doped with boron, lithium, or beryllium. This deposited dielectric material doped with boron, lithium, or beryllium is indicated in FIG. 3 as thusly doped dielectric material 46. This is shown on the lefthand portion of FIG. 3, that is, the portion to the left of the superimposed vertical dashed separator line. For comparative purposes, the righthand portion of FIG. 3 (i.e. the portion to the right of the superimposed vertical dashed separator line) shows a reference workflow in which the deposited dielectric material is not doped with boron, lithium, or beryllium. This is the reference undeposited dielectric material $46_{ref}$ shown in FIG. 3. The righthand portion of FIG. 3 is shown only for comparative purposes, and in an actual semiconductor device fabrication process the deposition step 30 deposits only the doped dielectric material 46. The dopant should have a small atomic number (Z) and incorporate in the dielectric material as an interstitial dopant. The interstitial dopant examples here given include: lithium (Z=3); beryllium (Z=4); and boron (Z=5). The deposited dielectric material 46 is, in some nonlimiting illustrative embodiments, $Si_{1-x-y}C_xN_y$ where $0 \leq x \leq 1$ and $0 \leq y \leq 1$. The reference deposited dielectric material $46_{ref}$ is $Si_{1-x-y}C_xN_y$, while the deposited doped dielectric material can be suitably designated as $Si_{1-x-y}C_xN_y{:}Li$ for lithium doping, or $Si_{1-x-y}C_xN_y{:}Be$ for beryllium doping, or $Si_{1-x-y}C_xN_y{:}B$ for boron doping. In some nonlimiting illustrative embodiments, the deposited dielectric material 46 is doped with boron, lithium, or beryllium at a concentration of between $10^{13}$ to $10^{18}$ atoms/cm³.

By way of nonlimiting illustrative example, one approach for performing the deposition step 30 is by way of chemical vapor deposition (CVD) of $Si_{1-x-y}C_xN_y$. In this example, the precursor can be 1,1,1,3,3,3-hexamethyldisilazane $[(CH_3)_3Si]_2NH$ or 1,1,3,3-tetramethyldisilazane $[(CH_3)_2SiH]_2NH$, SiC and Si3N4 power. In this illustrative example, the dopant for the deposited dielectric material 46 is boron, which can be supplied as a $B_2H_6$, $BF_4$, or B precursor. The flow rate in this nonlimiting example is in a range of 10-1000 mL/min, temperature in a range of 600-2000° C., and deposition time in a range of 10 seconds to 1 hour. This is merely a nonlimiting illustrative example.

As seen in FIG. 3, the deposited dielectric material 46 is thick enough to "bury" the 3D conductive channels 40, so that some of the deposited dielectric material 46 coats on top of the 3D conductive channels 40. In a planarization step 32 indicated in FIG. 1 and for which an illustrative example is shown in FIG. 4, chemical mechanical polishing (CMP) is performed to remove a top portion of the deposited dielectric material and to expose tops of the 3D conductive channels. While CMP is described here, other types of planarization are contemplated, such as mechanical polishing without chemical assistance. The planarization step 32 removes enough material to expose the tops of the 3D conductive channels 40, including the portion of the conformal sacrificial layer 42 that was deposited on the tops of the 3D conductive channels 40, as can be seen by comparison of FIGS. 3 and 4. This results in the portion of the deposited dielectric material 46 filling the spaces 44 between the 3D conductive channels 40 (compare FIG. 2) being isolated. These remaining portions of the deposited dielectric material 46 are destined to be the dummy fins. However, they remain physically connected with the 3D conductive channels 40 by the remaining portions of the conformal sacrificial layer 42 still coating the sides of the 3D conductive channels 40, as seen in FIG. 4. That is, after the planarization step 32 the remaining portions of the conformal sacrificial layer 42 still coating the sides of the 3D conductive channels 40 are interposed between the 3D conductive channels 40 and the remaining deposited doped dielectric material 46.

In an etch step 34 indicated in FIG. 1 and for which an illustrative example is shown in FIG. 5, after the CMP step 32 the (remaining) conformal sacrificial layer coating 42 coating the 3D conductive channels 40 is removed by etching to form dummy fins 50 comprising the remaining deposited dielectric material. The etch 34 may, by way of nonlimiting illustrative example, be a dry etch employing argon (Ar), ammonia ($NH_3$), or hydrogen fluoride (HF) etchant gas, performed at a temperature in the range 20-90° C. After the etch step 34, as seen in FIG. 5 the dummy fins 50 are spaced apart from the 3D conductive channels 40 by gaps 54. These gaps 54 correspond to where the conformal sacrificial layer 42 coating the sides of the 3D conductive channels 40 was removed. As diagrammatically shown on the lefthand portion of FIG. 5 (that is, the portion to the left of the superimposed vertical dashed separator line), the deposited doped dielectric material 46 is robust against the etching 34, and hence the dummy fins 50 remaining after the etch step 34 retain their shape and size (i.e. critical dimension, CD) after the etch 34. By contrast, as diagrammatically shown on the righthand portion of FIG. 5 (that is, the portion to the right of the superimposed vertical dashed separator line), the deposited undoped dielectric material $46_{ref}$ is not robust against the etching 34—rather, the etching 34 attacks the undoped dielectric material $46_{ref}$ and removes a portion thereof. Hence, dummy fins $50_{ref}$ remaining after the etch step 34 applied to the undoped dielectric material $46_{ref}$ do not retain their shape and size (i.e. critical dimension, CD) after the etch 34, but rather the critical dimension shrinks.

Figure 6:
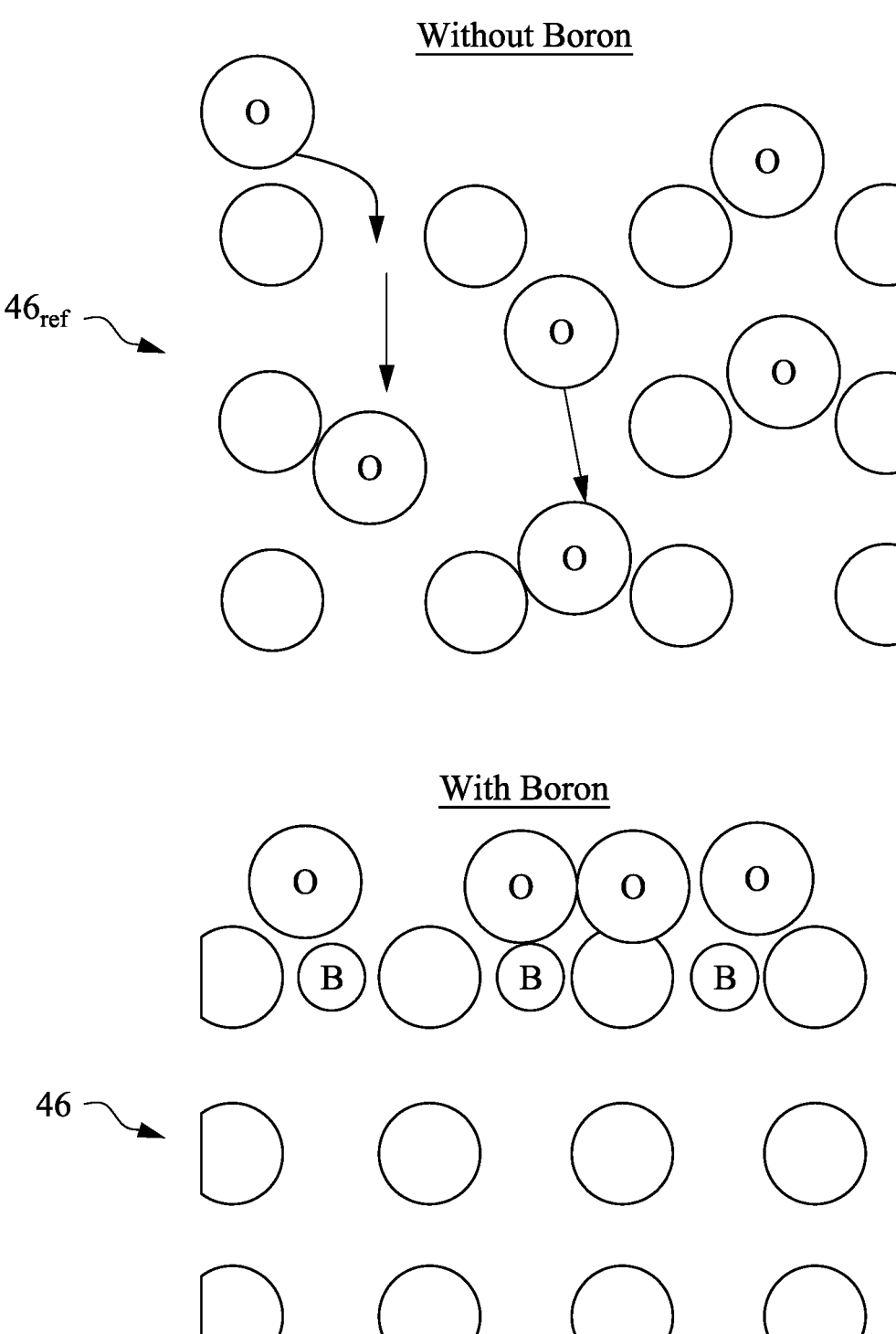
FIG. 6 diagrammatically illustrates a mechanism by which boron doping improves robustness of three-dimensional (3D) dummy fins.

With reference to FIG. 6, and without being limited to any particular theory of operation, it is believed that the improved robustness of the deposited doped dielectric material 46 that is doped with lithium, beryllium, or boron is due to the lithium, beryllium, or boron dopant incorporating as an interstitial dopant in the doped dielectric material 46, and that the interstitial lithium, beryllium, or boron dopant atoms block ingress of oxygen atoms into the doped dielectric material 46. This is shown diagrammatically in FIG. 6, where the top diagram shows the reference undoped dielectric material $46_{ref}$ and the bottom diagram shows the doped dielectric material 46. Oxygen atoms can ingress into the reference undoped dielectric material $46_{ref}$ interstitially, and produce oxidation of the reference undoped dielectric material $46_{ref}$. The oxidized reference undoped dielectric material $46_{ref}$ then is more susceptible to damage during the etch step 34. In FIG. 6, top diagram, this is shown by indicating atoms of the undoped dielectric material $46_{ref}$ and ingress of oxygen atoms (indicated in FIG. 6 by the label "O") into the dielectric material $46_{ref}$.

By contrast, in the doped dielectric material 46, the lithium, beryllium, or boron interstitial dopant tends to react with oxygen near the surface of the material 46. FIG. 6, bottom diagram shows an example for boron dopant, where boron dopant atoms at or near the surface are shown in FIG.

6, bottom diagram, indicated by the label "B". The boron atoms react with oxygen to form a surface layer of $B_2O_3$ which blocks further ingress of oxygen into the doped dielectric material 46, thus forming a protective surface layer rich in $B_2O_3$. Similar formation of $B_2O_3$ is expected at or near an interface with another material if oxygen would otherwise move from that other material into the doped dielectric material 46.

With brief reference back to FIG. 3, a further benefit of the lithium, beryllium, or boron doping is that the surface layer rich in $B_2O_3$ (or lithium oxide or beryllium oxide, in the case of lithium or beryllium doping, respectively) forms an additional amount of thickness (and/or density) that serves as a sacrificial etch layer during the etch step 34. This is shown in FIG. 2 as an additional thickness $d_{swell}$ for the deposited doped dielectric material 46, compared with the reference undoped dielectric material 46$_{ref}$. While this is directly observable at the upper surface, it is expected that additional density will accumulate at the sides where the deposited doped dielectric material 46 is in contact with the conformal sacrificial layer 42 as well.

Yet a further benefit of the lithium, beryllium, or boron doping is believed to be improved temperature stability. This is because Si—B—C—N compounds typically have higher specific strength-temperature characteristic than Si—C—N compounds.

Figure 7:
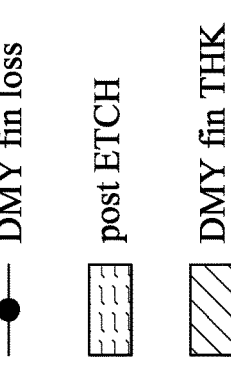
FIG. 7 presents experimental results as described herein.
Figure 7:
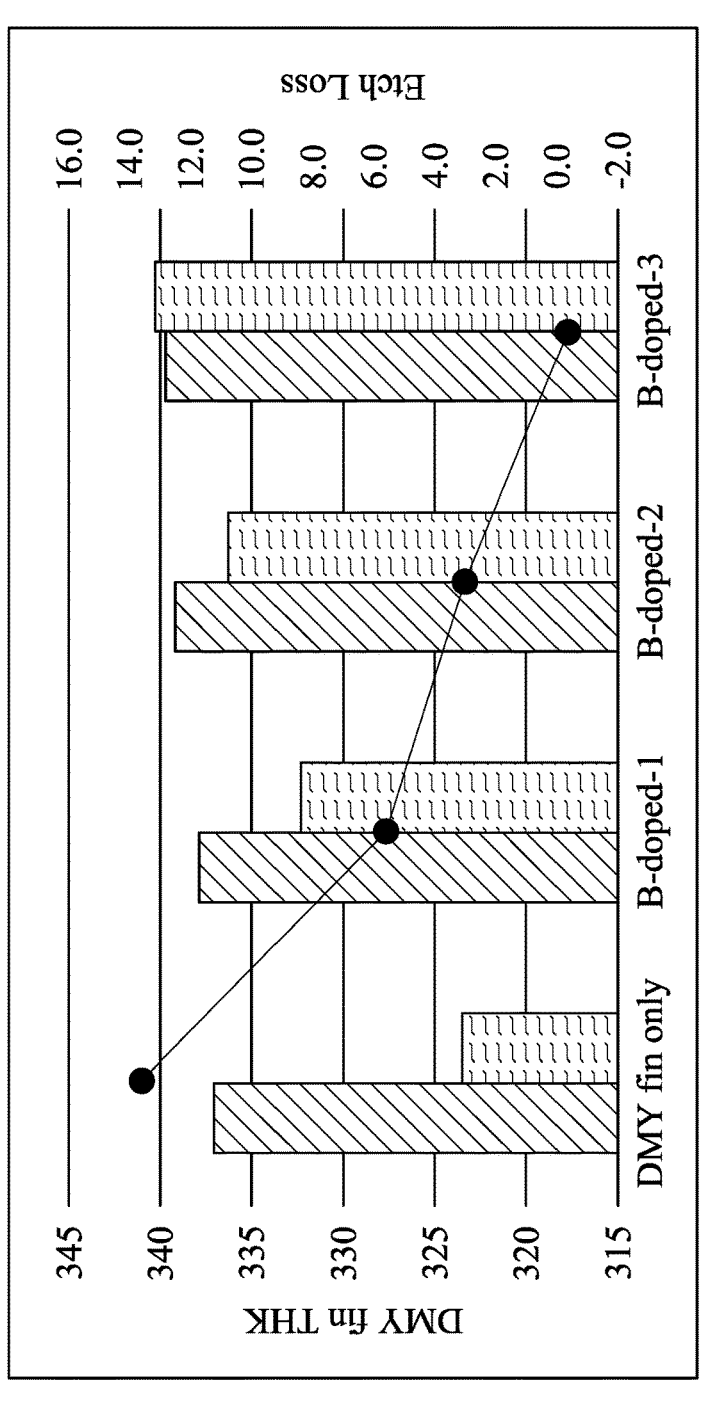
Figure 7:
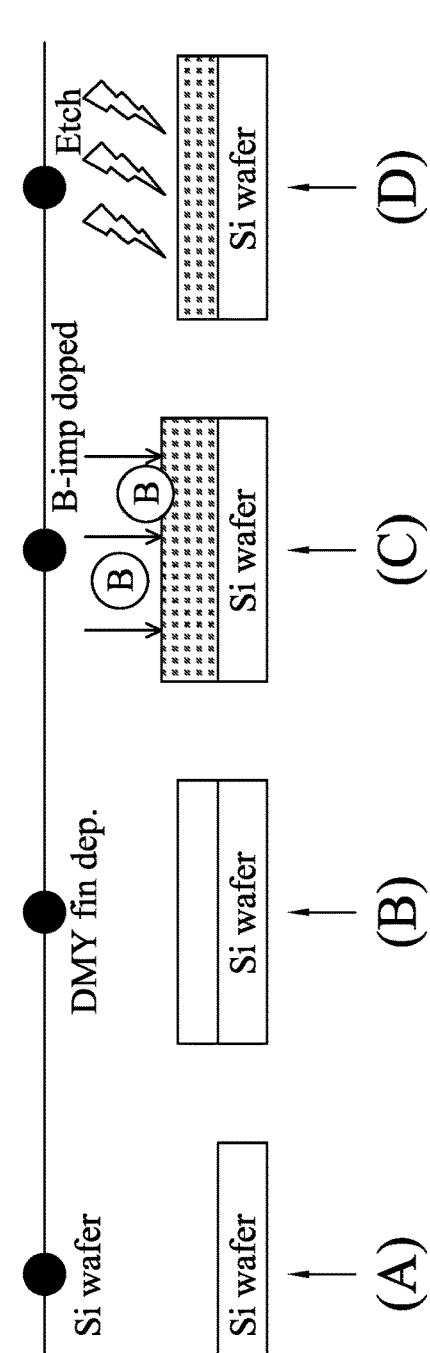

With reference to FIG. 7, these beneficial effects were demonstrated experimentally as follows. As indicated at the bottom of FIG. 7, samples were prepared by: (A) starting with a silicon wafer; (B) deposit a SiCN dielectric layer; (C) perform boron implantation to dope with boron (except for the "DMY fin only" sample); and (D) perform etching in accord with the etch step 34 of FIG. 1. Transmission electron microscopy (TEM) was used to measure the SiCN thickness before and after the etch step (D). The plot of FIG. 7 shows the results for four samples: DMY fin only (here the B implantation step (C) was skipped); and B-doped-1, B-doped-2, and B-doped-3 samples with successively increasing B concentration (in the range $10^{13}$-$10^{18}$ atoms/ $cm^3$). In the plot of FIG. 7, the lefthand bar for each sample is the TEM-measured thickness before the etch step (D), and the righthand bar is the TEM-measured thickness after the etch step (D). The thickness scale is shown on the left of the plot (range 315-345 nanometers). The difference in height between the lefthand bar (thickness before etch) and the righthand bar (thickness after etch) is the etch loss, which is also indicated in the plot by points connected by a line. The etch loss scale is shown on the right of the plot (range –2.0 to 16 nanometers).

As can be seen in FIG. 7, there is about 13 nanometers of etch loss for the DMY fin only sample which received no boron doping. The B-doped-1, B-doped-2, and B-doped-3 samples show decreasing etch loss with increasing boron concentration, with the highest boron concentration B-doped-3 sample showing no etch loss at all (actually a thickness gain after etching is shown, but this "increase" is under 1 nanometer and is believed to be within the margin of error of the TEM thickness measurement). This demonstrates that the boron doping protects against etch loss.

As can be further seen in FIG. 7, the before-etch thickness increases with increasing boron concentration, from around 323 nanometers for the undoped sample (DMY fin only) to about 340 nanometers for the B-doped-3 sample. This is believed to reflect the swell thickness increase $d_{swell}$ indicated in FIG. 2.

FIG. 7 presents results for boron doping. However, it is expected that similar benefits will be attainable with lithium doping or with beryllium doping. This is because lithium, beryllium, and boron are similarly sized atoms (atomic number Z being Z=3, Z=4, and Z=5 for lithium, beryllium, and boron respectively) so that lithium and beryllium should also be interstitial dopants in $Si_{1-x-y}C_xN_y$. Additionally, while boron reacts with oxygen to form $B_2O_3$, lithium similarly reacts with oxygen to form $Li_2O$ and beryllium similarly reacts with oxygen to form BeO. Hence, lithium or beryllium dopant atoms at or near the surface of the dielectric material or at or near an interface with another material are expected to react with oxygen form a protective surface oxide that prevents further ingress of oxygen into the deposited doped dielectric material 46. The protective $Li_2O$ or BeO is also expected to provide surface swell. Hence, the experimental results for boron doping presented in FIG. 7 are expected to also be achievable with lithium or beryllium doping.

As a nonlimiting illustrative quantitative example, the 3D conductive channels 40 formed in the operation 10 of FIG. 1 may be fins of finFETs with fin width of around 10-20 nanometers (10-20 nm), and the dummy fins or other 3D dielectric features 50 formed in the operation 12 may also be formed with a width of around 10-40 nm, and the gaps 54 (see FIG. 5) from the edge of a fin 40 to the facing edge of a neighboring dummy fin 50 (and hence the thickness of the conformal sacrificial layer 42 coating the fins 40 in FIGS. 2-4) may be around 10-40 nm.

Figure 8:
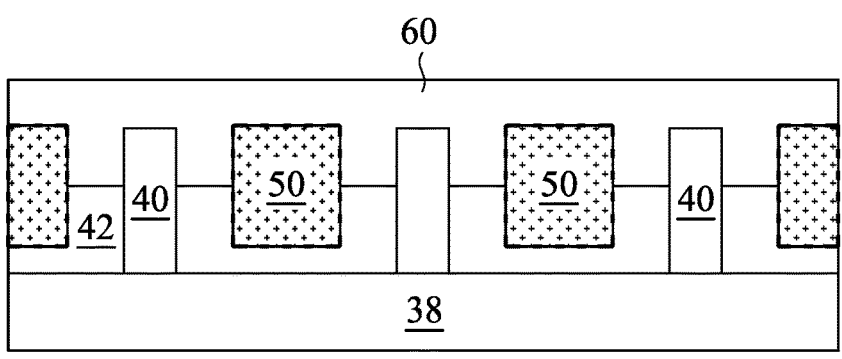
FIGS. 8, 9, and 10 diagrammatically illustrate, by way of cross-sectional views, examples of the state of an under-fabrication device at various steps in the method of FIG. 1.
Figure 9:
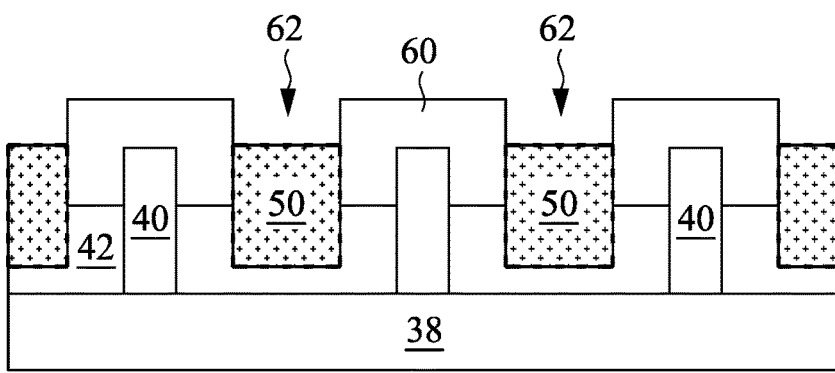
Figure 10:
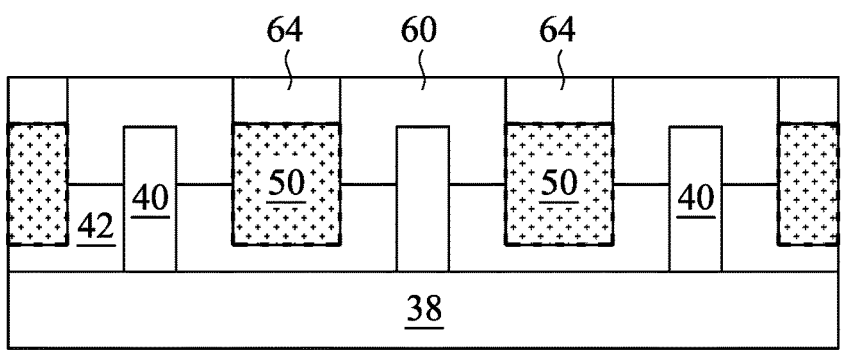
Figure 11:
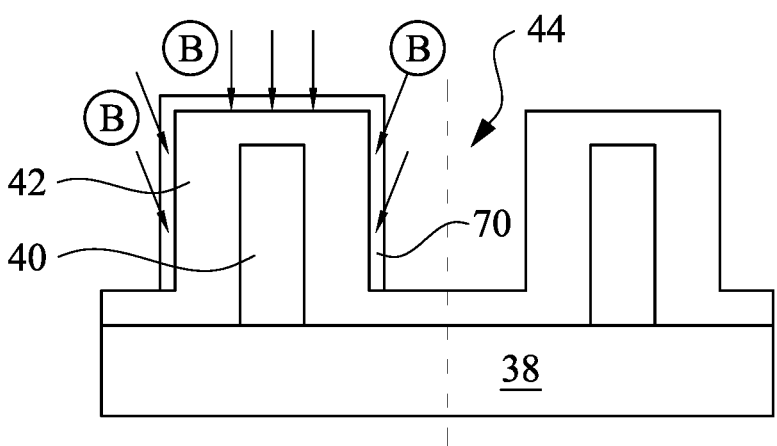
FIGS. 11, 12, 13, and 14 diagrammatically illustrate, by way of cross-sectional views, examples of the state of an under-fabrication device at various steps in the method of FIG. 1.
Figure 12:
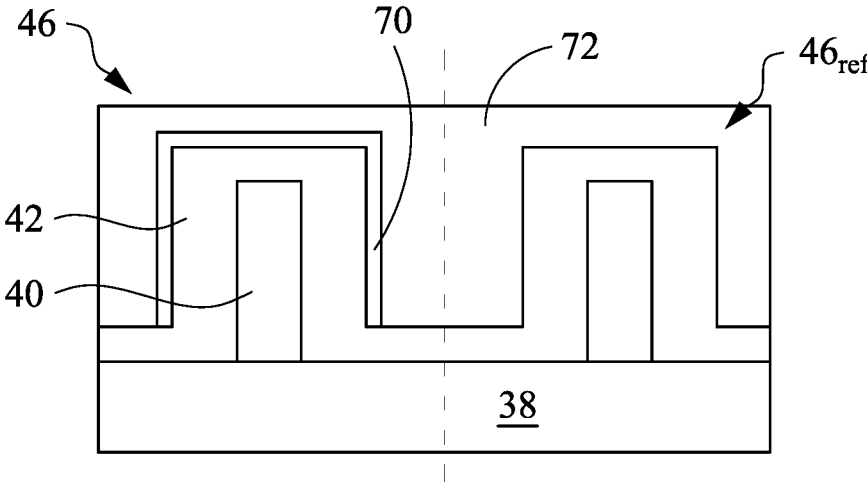

With reference to FIGS. 8, 9, and 10, an illustrative example of operations 14, 18, and 19 of FIG. 1 are shown. FIG. 8 illustrates the under-fabrication device as shown in FIG. 5 (lefthand side with the doped dummy fins 50), extended to include three of the mutually parallel 3D conductive structures 40 and two intervening dummy fins 50 arranged parallel with the 3D conductive structures 40. FIG. 8 shows the device after operation 14 in which a dummy gate line 60 has been formed over the three 3D conductive structures 40 (e.g., fins in the case of finFET fabrication) and two intervening dummy fins 50 (e.g., dummy fins in the case of finFET fabrication). The dummy gate line 60 is oriented perpendicular to the fins 40 and perpendicular to the dummy fins 50. Note that the dummy gate line 60 extends over the fins 40 and dummy fins 50. FIG. 9 shows the state of the under-fabrication device after operation 18 of cutting the gate line 60 at the dummy fins 50 to form gate cuts 62. FIG. 10 shows the state of the under-fabrication device after operation 20 in which gate isolation plugs 64 of a dielectric material have been formed to fill in the gate cuts 62. This can then be followed by the gate replacement process 22 of FIG. 1 to replace the dummy gate line with gate conductor material. FIGS. 8-10 show one nonlimiting illustrative application of the dummy fins 50. As previously noted, the dummy fins 50 can serve various purposes such as for optical proximity correction (OPC) to enhance a pattern density and pattern uniformity, or to improve chemical-mechanical polishing (CMP) performance during CMP steps of the transistor fabrication process, and/or so forth.

Figure 13:
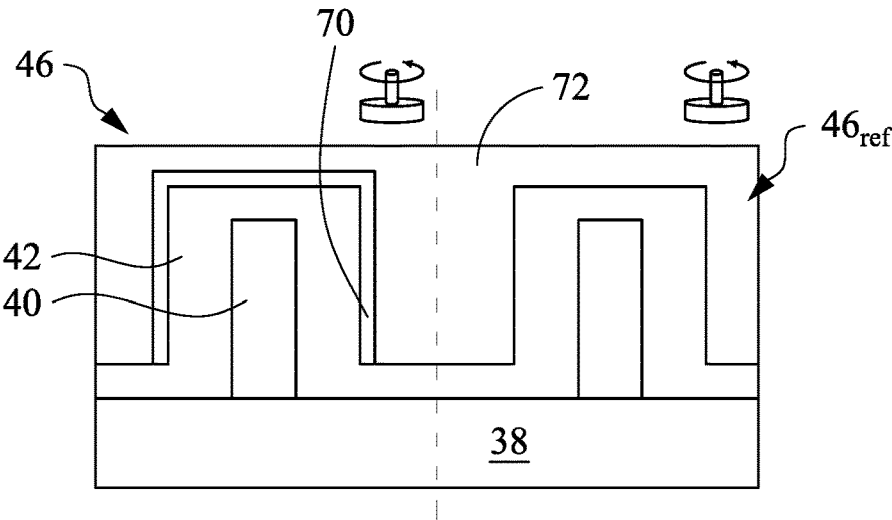
Figure 14:
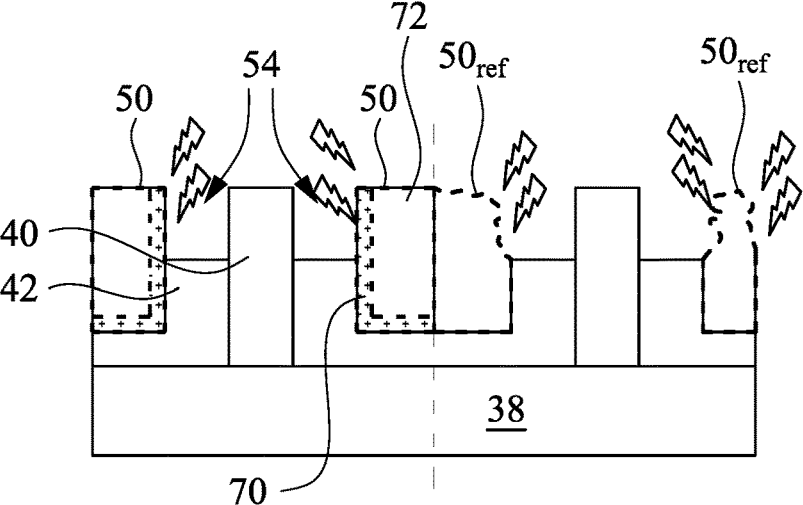

With reference to FIGS. 11, 12, 13, and 14, a variant embodiment of the operation 12 of FIG. 1 for forming the dummy fins 50 is shown. This variant embodiment starts with the under-fabrication device in the state shown in FIG. 2, providing the mutually parallel 3D conductive channels 40 coated with the conformal sacrificial layer 42 on the semiconductor substrate 38. However, in the variant embodiment of FIGS. 11-14, the dielectric material deposition operation 30 corresponding to FIG. 3 of the approach of FIGS. 2-5 is performed as two steps. In a first step shown in FIG. 11, a basal dielectric layer 70 is formed. The basal dielectric layer 70 comprises the dielectric material (e.g. $Si_{1-x-y}C_xN_y$) doped with boron, lithium, or beryllium which is formed over the conformal sacrificial layer 42 coating the 3D conductive channels 40. The basal dielectric layer 70 does not fill the spaces 44 between the 3D conductive channels 40. In some embodiments, the basal dielectric layer 70 is formed by depositing an initial layer of the dielectric material without boron, lithium, or beryllium doping (this initial layer does not fill the spaces 44 between the 3D conductive channels 40), followed by implanting boron, lithium, or beryllium atoms into the initial layer to form the basal dielectric layer of the dielectric material doped with boron, lithium, or beryllium, as diagrammatically indicated in FIG. 11. As then shown in FIG. 12, after forming the basal dielectric layer 70, the dielectric material is deposited without boron, lithium, or beryllium doping to fill the spaces between the 3D conductive channels with dielectric material 72 that is not doped with boron, lithium, or beryllium. FIG. 13 then shows the planarization step 32, e.g. being performed by CMP. FIG. 14 then shows the result of the etch step 34. The result is expected to be analogous to that shown in FIG. 5. As shown on the lefthand portion of FIG. 14, that is, the portion to the left of the superimposed vertical dashed separator line, the basal dielectric layer 70 serves as the protective layer enriched with the lithium, beryllium, or boron dopant which is expected to from a protective $Li_2O$, BeO, or $B_2O_3$ oxide, respectively. By contrast, the reference undoped example on the righthand portion of FIG. 14 is identical with the righthand portion shown in FIG. 5.

Figure 15:
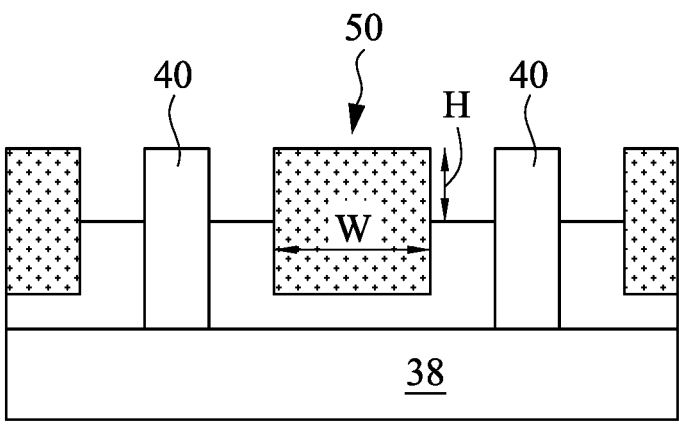
FIGS. 15 and 16 diagrammatically illustrate, by way of cross-sectional views, some suitable parameters of 3D dummy fins formed by approaches disclosed herein.

With reference now to FIG. 15, an under-fabrication finFET structure including the fins 40 and dummy fins 50 with boron doping formed on the substrate 38 as described with reference to FIGS. 2-5 is shown. The dummy fin 50 is formed with a boron doping level in a range of $10^{13}$ to $10^{18}$ atoms/cm³. The dummy fin 50 has a width W of 10-20 nanometers in some embodiments, and a height H of 20-60 nanometers in some embodiments. These are merely nonlimiting illustrative ranges.

Figure 16:
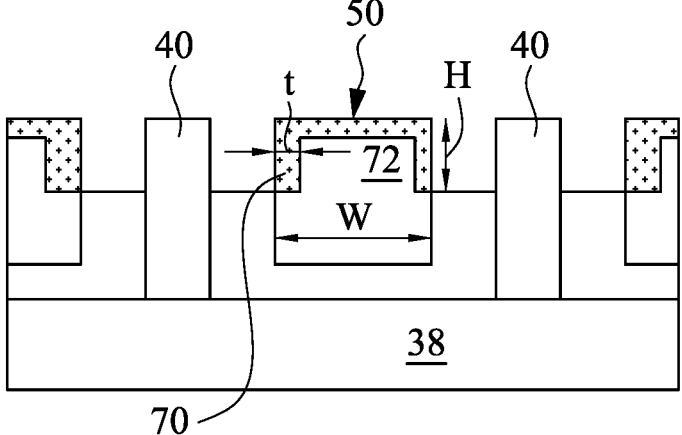

With reference now to FIG. 16, an under-fabrication finFET structure including the fins 40 and dummy fins 50 with boron doping formed on the substrate 38 as described with reference to FIGS. 2 and 11-14 is shown. The dummy fin 50 is formed with the basal layer 70 having a boron doping level in a range of $10^{13}$ to $10^{18}$ atoms/cm³ in some embodiments, for example over a thickness t of about 0-10 nanometers in some embodiments. The dummy fin 50 has a width W of 10-20 nanometers in some embodiments, and a height H of 20-60 nanometers in some embodiments. These are merely nonlimiting illustrative ranges.

Figure 17:
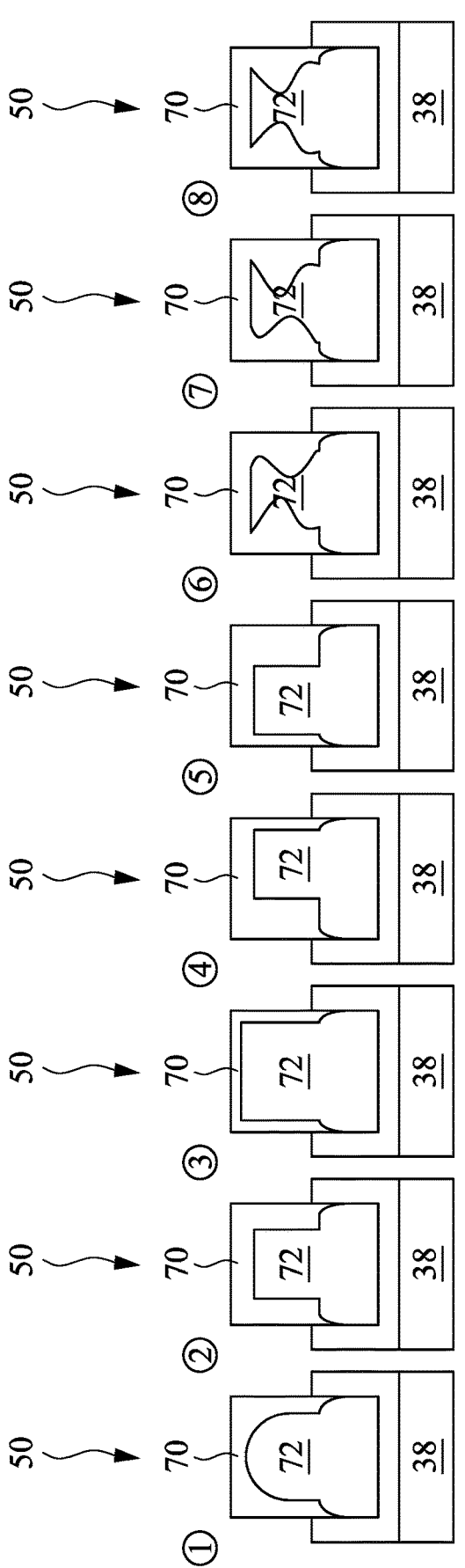
FIG. 17 diagrammatically illustrates, by way of cross-sectional views, some variant geometries of 3D dummy fins formed by approaches disclosed herein.

With reference to FIG. 17, it is noted that in the embodiment of FIGS. 11-14 and 16 the detailed shape of the boron-rich (or lithium-rich, or beryllium-rich) surface 70 over the undoped region 72 of the dummy fin 50 can vary depending on the concentration of boron, the detailed parameters used in forming the basal layer 70, and so forth. Examples 1-8 shown in FIG. 17 present some possible shapes.

In the following, some further embodiments are described.

In a nonlimiting illustrative embodiment, a method of manufacturing a semiconductor device is disclosed. The method comprises: forming mutually parallel three-dimensional (3D) conductive channels coated with a conformal sacrificial layer, the 3D conductive channels coated with the conformal sacrificial layer being formed on a semiconductor substrate; depositing a dielectric material to fill spaces between the 3D conductive channels coated with the conformal sacrificial layer, wherein a portion or all of the deposited dielectric material is doped with boron, lithium, or beryllium; performing chemical mechanical polishing (CMP) to remove a top portion of the deposited dielectric material and to expose tops of the 3D conductive channels; and after the CMP, removing the conformal sacrificial layer coating the 3D conductive channels by etching to form 3D dielectric features spaced apart from the 3D conductive channels and comprising the deposited dielectric material.

In a nonlimiting illustrative embodiment, a semiconductor device comprises: three-dimensional (3D) conductive channels disposed on a semiconductor substrate; and 3D dielectric features spaced apart from the 3D conductive channels and comprising a dielectric material. A portion or all of the dielectric material of the 3D dielectric features is doped with boron, lithium, or beryllium. In some embodiments, the 3D conductive channels are fins of fin field-effect transistors (finFETs), and the 3D dielectric features are dummy fins.

In a nonlimiting illustrative embodiment, a method of manufacturing a semiconductor device comprises: forming fins coated with a conformal sacrificial layer, the fins coated with the conformal sacrificial layer being formed on a semiconductor substrate; depositing a dielectric material to fill spaces between the fins coated with the conformal sacrificial layer, wherein a portion or all of the deposited dielectric material is doped with boron at a concentration of $10^{13}$ to $10^{18}$ atoms/cm³; performing planarization to remove a top portion of the deposited dielectric material and to expose tops of the fins; after the CMP, removing the conformal sacrificial layer coating the fins by etching to form dummy fins spaced apart from the fins and comprising the deposited dielectric material; and fabricating fin field-effect transistors (finFETs) having the fins as conductive channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

forming mutually parallel three-dimensional (3D) conductive channels coated with a conformal sacrificial layer, the 3D conductive channels coated with the conformal sacrificial layer being formed on a semiconductor substrate;

depositing a dielectric material to fill spaces between the 3D conductive channels coated with the conformal sacrificial layer, wherein the depositing of the dielectric material includes:

forming a basal dielectric layer of the dielectric material doped with boron, lithium, or beryllium over the conformal sacrificial layer coating the 3D conductive channels, the basal dielectric layer not filling the spaces between the 3D conductive channels, and after forming the basal dielectric layer, depositing the dielectric material without boron, lithium, or beryllium doping to fill the spaces between the 3D conductive channels with the dielectric material not doped with boron, lithium, or beryllium;

performing chemical mechanical polishing (CMP) to remove a top portion of the deposited dielectric material and to expose tops of the 3D conductive channels; and after the CMP, removing the conformal sacrificial layer coating the 3D conductive channels by etching to form 3D dielectric features spaced apart from the 3D conductive channels and comprising the deposited dielectric material.

2. The method of claim 1 wherein the forming of the basal dielectric layer includes:

depositing an initial layer of the dielectric material without boron, lithium, or beryllium doping, the initial layer not filling the spaces between the 3D conductive channels; and implanting boron, lithium, or beryllium atoms into the initial layer to form the basal dielectric layer of the dielectric material doped with boron, lithium, or beryllium.

3. The method of claim 1 wherein the basal dielectric layer is doped with boron, lithium, or beryllium at a concentration of $10^{13}$ to $10^{18}$ atoms/$cm^3$.

4. The method of claim 1 wherein the basal dielectric layer is doped with boron.

5. The method of claim 1 wherein the deposited dielectric material is $Si_{1-x-y}C_xN_y$ where $0 \leq x \leq 1$ and $0 \leq y \leq 1$.

6. The method of claim 1 wherein the conformal sacrificial layer coating the 3D conductive channels comprises a silicon nitride material.

7. The method of claim 1 wherein the depositing of the dielectric material comprises depositing the dielectric material by chemical vapor deposition (CVD) and includes doping the basal dielectric layer with boron during the CVD by flowing a precursor comprising B, $B_2H_6$, or $BF_4$.

8. The method of claim 1 further comprising:

fabricating transistors on the semiconductor substrate, the transistors including transistor channels formed from the 3D conductive channels.

9. The method of claim 8 wherein the transistors further include transistor gates with gate isolation structures.

10. The method of claim 8 wherein the transistors are fin field-effect transistors (finFETs), the 3D conductive channels are fins of the finFETs, and the 3D dielectric features are dummy fins.

11. The method of claim 1 wherein the basal dielectric layer is doped with lithium.

12. The method of claim 1 wherein the basal dielectric layer is doped with beryllium.

13. A method of manufacturing a semiconductor device, the method comprising:

forming three-dimensional (3D) conductive channels disposed on a semiconductor substrate; and forming 3D dielectric features spaced apart from the 3D conductive channels and comprising $Si_{1-x-y}C_xN_y$ dielectric material where $0 \leq x \leq 1$ and $0 \leq y \leq 1$;

wherein all of the $Si_{1-x-y}C_xN_y$ dielectric material of the 3D dielectric features is doped with boron, lithium, or beryllium.

14. The method of claim 13 wherein:

all of the $Si_{1-x-y}C_xN_y$ dielectric material of the 3D dielectric features is doped with boron, lithium, or beryllium at a concentration of $10^{13}$ to $10^{18}$ atoms/$cm^3$.

15. The method of claim 13 wherein the 3D conductive channels are fins of fin field-effect transistors (finFETs), and the 3D dielectric features are dummy fins.

16. The method of claim 13 wherein all of the $Si_{1-x-y}C_xN_y$ dielectric material of the 3D dielectric features is doped with boron.

17. The method of claim 13 wherein all of the $Si_{1-x-y}C_xN_y$ dielectric material of the 3D dielectric features is doped with lithium.

18. The method of claim 13 wherein all of the $Si_{1-x-y}C_xN_y$ dielectric material of the 3D dielectric features is doped with beryllium.

19. A method of manufacturing a semiconductor device, the method comprising:

forming fins coated with a conformal sacrificial layer, the fins coated with the conformal sacrificial layer being formed on a semiconductor substrate;

depositing a dielectric material to fill spaces between the fins coated with the conformal sacrificial layer, wherein a portion or all of the deposited dielectric material is doped with boron at a concentration of $10^{13}$ to $10^{18}$ atoms/$cm^3$, wherein one of: (i) all of the deposited dielectric material is doped with boron, or (ii) only an initial layer of the dielectric material is doped with boron;

performing planarization to remove a top portion of the deposited dielectric material and to expose tops of the fins;

after the planarization, removing the conformal sacrificial layer coating the fins by etching to form dummy fins spaced apart from the fins and comprising the deposited dielectric material; and fabricating fin field-effect transistors (finFETs) having the fins as conductive channels.

20. The method of claim 19 wherein:

the deposited dielectric material is $Si_{1-x-y}C_xN_y$ where $0 \leq x \leq 1$ and $0 \leq y \leq 1$; and the conformal sacrificial layer coating the fins comprises a silicon nitride material.

* * * * *